(12) United States Patent
Krueger (10) Patent No.: US 8,165,657 B2
(45) Date of Patent: Apr. 24, 2012

(54) METHOD AND APPARATUS FOR MAGNETIC RESONANCE IMAGING ON THE BASIS OF A GRADIENT ECHO SEQUENCE

(75) Inventor: Gunnar Krueger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1201 days.

(21) Appl. No.: 11/684,086

(22) Filed: Mar. 9, 2007

(65) Prior Publication Data

US 2007/0238973 A1  Oct. 11, 2007

(30) Foreign Application Priority Data

Mar. 10, 2006  (DE) .......................... 10 2006 011 253

(51) Int. Cl.
*A61B 5/055* (2006.01)
(52) U.S. Cl. ........ 600/410; 600/407; 324/306; 324/307; 324/309
(58) Field of Classification Search .................. 324/307, 324/309; 600/410, 420
See application file for complete search history.

(56) References Cited

U.S. PATENT DOCUMENTS

| | | | |
|---|---|---|---|
| 5,245,282 A * | 9/1993 | Mugler et al. ................. | 324/309 |
| 6,340,887 B1 | 1/2002 | Liu et al. | |
| 6,486,667 B1 * | 11/2002 | Wu et al. ....................... | 324/306 |
| 6,498,946 B1 * | 12/2002 | Foo et al. ....................... | 600/410 |
| 6,564,080 B1 * | 5/2003 | Kimura .......................... | 600/410 |
| 6,615,676 B2 | 9/2003 | Rankin | |
| 6,888,350 B2 | 5/2005 | Deimling | |
| 7,071,689 B2 * | 7/2006 | Golay et al. ................... | 324/309 |
| 7,546,155 B2 * | 6/2009 | Foo et al. ....................... | 600/410 |
| 2003/0069493 A1 * | 4/2003 | Pan et al. ....................... | 600/410 |
| 2005/0030024 A1 * | 2/2005 | Golay et al. ................... | 324/307 |
| 2005/0033151 A1 | 2/2005 | Wu et al. | |

OTHER PUBLICATIONS

Held, P., et al., Journal of Clinical Imaging, 24 (2000) 337-343.*
"Towards a Single-Sequence Neurologic Magnetic Resonance Imaging Examination: Multiple-Contrast Images From an IR TrueFISP Experiment." Gulani et al., Investigative Radiology, vol. 39, No. 12 (2004) pp. 767-774.

* cited by examiner

*Primary Examiner* — Tse Chen
*Assistant Examiner* — Baisakhi Roy
(74) *Attorney, Agent, or Firm* — Schiff Hardin LLP (57) ABSTRACT

In a method and apparatus for magnetic resonance imaging on the basis of a gradient echo sequence by excitation of nuclear spins and measurement of radio-frequency signals arising from the excited nuclear spins:
 (a) the magnetization of the spins is prepared by an inversion pulse;
 (b) a number of steps for spin excitation are implemented as well as acquisition of an RF response signal for a first image contrast, with the measurement data being acquired along a first two-dimensional slice, and this first two-dimensional slice being parallel to a plane spanned by two coordinate axes x, y standing orthogonal to one another;
 (c) implementation of a number of steps for spin excitation as well as acquisition of an RF response signal for a second image contrast, with the measurement data being acquired along the first two-dimensional slice that exist in (b); and
 (d) repetition of steps (a) through (c) for further two-dimensional slices that are offset parallel to the first two-dimensional slice along a third coordinate axis z that is orthogonal to the first two coordinate axes x and y.

20 Claims, 6 Drawing Sheets

METHOD AND APPARATUS FOR MAGNETIC RESONANCE IMAGING ON THE BASIS OF A GRADIENT ECHO SEQUENCE

BACKGROUND OF THE INVENTION

1. Field of the Invention

The present invention generally concerns magnetic resonance tomography (MRT) as used in medicine for examination of patients. The present invention more particularly concerns a magnetic resonance tomography apparatus as well as a method for operation of such a magnetic resonance tomography apparatus, with which a high contrast can be achieved for imaging on the basis of a gradient echo sequence.

2. Description of the Prior Art

MRT is based on the physical phenomenon of nuclear magnetic resonance and has been successfully used for over 15 years as an imaging modality in medicine and in biophysics. In this examination modality the subject is exposed to a strong, constant magnetic field. The nuclear spins in the atoms in the subject, which were previously randomly oriented, are aligned.

Radio-frequency energy can now excite these "ordered" nuclear spins to a specific oscillation. This oscillation generates the actual measurement signal in MRT, the measurement signal being acquired by suitable acquisition coils. The measurement subject can be spatially coded in all three spatial directions by the use of non-homogeneous magnetic fields generated by gradient coils. The method allows a free selection of the slice to be imaged, so slice images of the human body can be acquired in all directions. MRT as a slice imaging method in medical diagnostics is distinguished as a non-invasive examination method primarily due to its versatile contrast capability. MRT has developed into a method superior to x-ray computed tomography (CT) due to the exceptional display capability of soft tissue. MRT today is based on the use of spin echo and gradient echo sequences that enable an excellent image quality with measurement times on the order of minutes.

The continuous technical development of the components of MRT apparatuses and the introduction of faster imaging sequences opens MRT to ever more fields of use in medicine. Real-time imaging to support minimally-invasive surgery, functional imaging in neurology and perfusion measurement in cardiology are only a few examples. In spite of the technical progress in the design of MRT apparatuses, image contrast and signal-noise ratio (SNR) of the MRT image remain limiting factors for many applications of MRT in medical diagnostics.

Particularly in the case of image acquisitions of the head, the goal is to ensure a good segmentation, meaning a good contrast between grey brain matter, white brain matter and cerebrospinal fluid (CSF). One possibility for this is a (semi) automated method for segmentation using T1-weighted MPRAGE data. In the following the MPRAGE sequence as well as the associated fundamentals are therefore initially described.

The acquisition of the data in MRT occurs in k-space (frequency domain). The MRT image in the image domain is linked with the MRT data in k-space by a Fourier transformation. The spatial coding of the subject which spans k-space occurs by means of gradients in all three spatial directions. For this purpose, auxiliary magnetic fields Gx, Gy and Gz, whose field strengths linearly depend on the respective spatial coordinates x, y and z, are superimposed on the homogeneous basic magnetic field. Without limitation as to generality, in the further discussion Cartesian k-space is assumed that is scanned (sampled) per slice or per line.

In MRT imaging the gradient fields are used in different ways. In selective slice excitation a gradient field is superimposed on the homogeneous basic field along one of the coordinate axes (typically the z-axis) during the RF pulse. By selection of a specific frequency spectrum of the RF pulse, only nuclei within a specific slice perpendicular to the z-axis are excited. For frequency coding, a gradient field (typically along the x-axis) is superimposed on the basic magnetic field during the acquisition of the RF signal. The readout of the RF signal ensues in N-equidistant time steps Δt. For phase coding a gradient field (typically along the y-axis) with a constant gradient strength is superimposed on the basic magnetic field for a specific time ty before the acquisition of the RF signal. The readout ensues by repetition of the sequence N times, with the gradient strength being increased in equidistant steps per repetition.

Figure 2A:
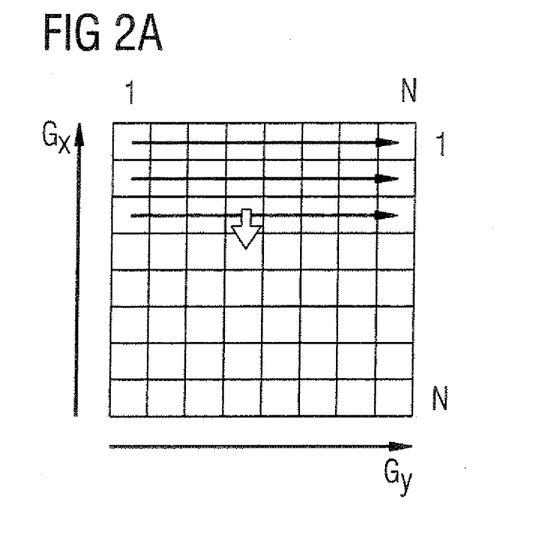
FIG. 2A schematically shows the principle of k-space scanning with the 2D Fourier method FIG. 2B schematically shows the principle of k-space scanning with the 3D Fourier method.
Figure 2B:
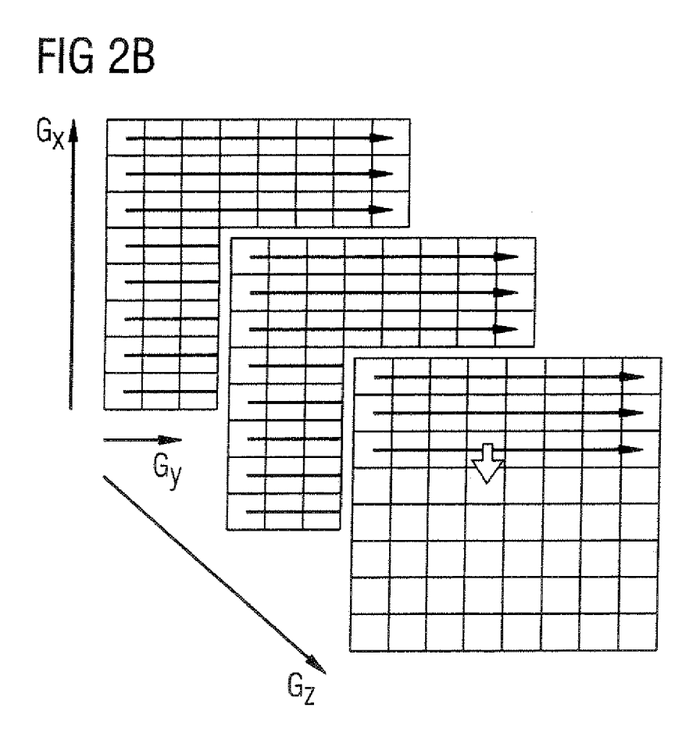

FIG. 2A shows the principle of MRT imaging with the 2D Fourier method. A slice is established by selective slice excitation along the z-axis; this slice of k-space is subsequently scanned line-by-line. The data of a single k-space line are frequency-coded by means of a gradient Gy upon readout. The readout of a line ensues in N equidistant time steps. Each line in k-space has the interval Δkx that is generated by a phase coding step. The imaging sequence is repeated N times for various values of the phase coding gradient Gx. In total, a number matrix with N×N data points is obtained, from which an MRT in the image domain can be constructed by 2D Fourier transformation. FIG. 2B shows the 3D Fourier method. The slice-selection gradient is replaced by a second phase coding gradient. This means that the entire volume of the nuclei is excited by the RF pulse and the spatial information is coded exclusively by orthogonal gradients, namely by two phase coding gradients and one frequency coding gradient. M slices perpendicular to the z-axis are acquired, each slice being scanned line-by-line in k-space. The coding within a slice of k-space ensues by a frequency coding gradient in the y-direction as well as a phase coding gradient in the x-direction. A number matrix with M×N×N data packets is thus obtained in total.

Figure 3:
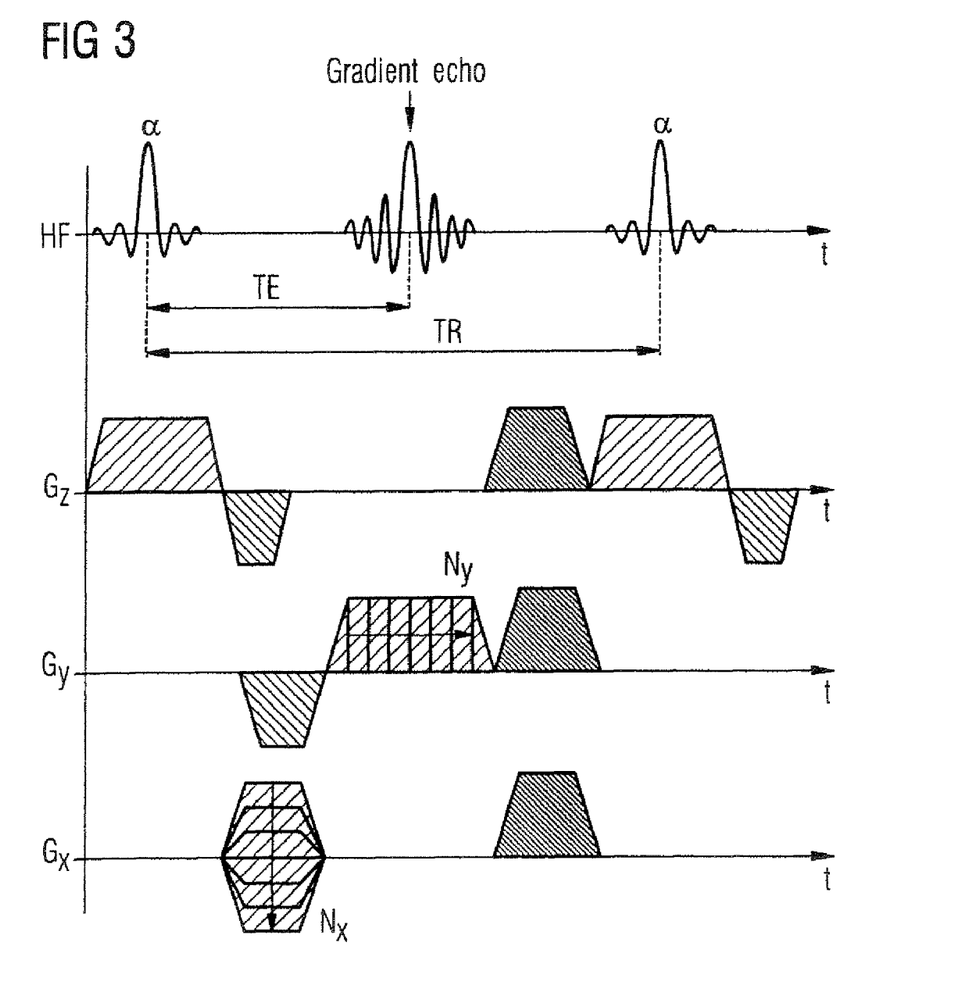
FIG. 3 shows the gradient and pulse scheme of the FLASH sequence.

FIG. 3 schematically shows the excitation and gradient scheme of the known FLASH (Fast Angle Low Shot) sequence. This is based on the principle of the gradient echo technique. Fast image sequences that are based on the principle of small angle excitation, and in which the echo signals generated exclusively by gradient reversal, are designated as gradient echo sequences (GE sequences). In small angle excitation, flip angles of á<90° are used, but only a small fraction of the longitudinal magnetization is rotated in the transversal plane. Thus it is not necessary to wait as long for the relaxation of the magnetization, which leads to significant time savings. Furthermore, the dephasing of the transverse magnetization caused by the two gradients is compensated by the polarity reversal, such that a gradient echo arises. In FIG. 3 the RF pulse with a small angle excitation below an angle is shown in the first line and the RF signal with the gradient echo is subsequently shown on the time axis. In the second line the slice-selection gradient Gz is plotted along the time. As already explained, the slice-selection gradient is superimposed on the homogeneous magnetic field along the z-axis during the RF pulse and the slice-selection gradient is subsequently reversed in terms of polarity for the purpose of dephasing. In the third line the frequency coding gradient Gy is shown along the time axis. A gradient field in the y-direction is superimposed on the homogeneous magnetic field for the frequency coding after polarity reversal of the gradient during the acquisition of the RF signal. The phase coding gradient Gx is shown along the time axis in line 4. For phase coding along the x-axis, a constant gradient is hereby switched on for a defined time before acquisition of the RF signal and the sequence is repeated Nx times. The transverse magnetization is destroyed after the data acquisition via spoiler gradients switched in each of the three spatial axes after acquisition of the RE signal. The echo time TE designated in FIG. 3 is the time from the radiation of the RF pulse up to the gradient echo and the repetition time TR is the time for a sequence pass.

Figure 4:
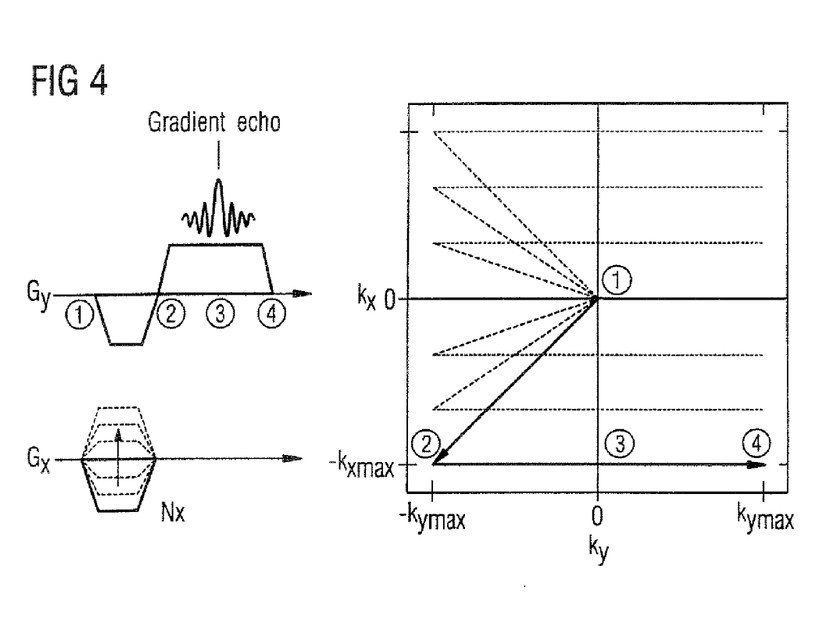
FIG. 4 schematically shows the principle of k-space scanning.

The scheme of the k-space scan of a gradient echo sequence is shown in FIG. 4. After the RF pulse the signal is located in the center of k-space (1). A dephasing of the signal at the point (2) occurs due to the phase coding gradients and the dephasing in the readout direction, A k-space line is scanned (3, 4) during the reverse-polarized readout gradients and the signal is acquired. The gradient echo occurs at the point (3). The entire process is repeated Nx times with phase coding gradients of various strengths such that an image of the entirety of k-space is generated.

Figure 5:
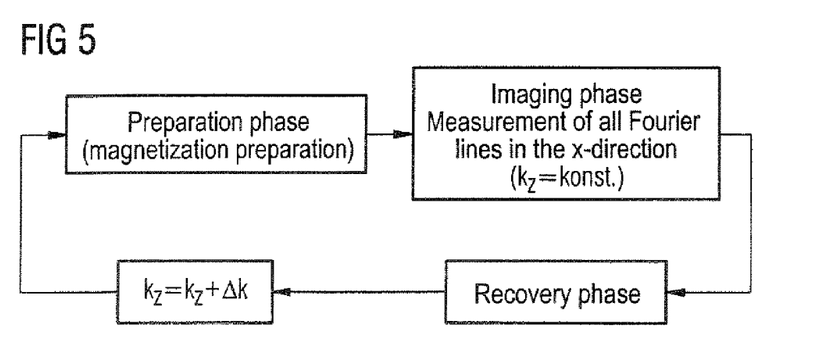
FIG. 5 schematically shows the MPRAGE sequence.

FIG. 5 shows the basic principle of the MPRAGE (Magnetization Prepared Rapid Gradient Echo) sequence. This is based on the 3D Fourier method as well as the magnetization preparation. A preparation phase is activated before the actual image phase to achieve shorter measurement times and a good tissue contrast. The preparation phase effects a preparation of the magnetization that is dependent on the relaxation times T1 and T2. The magnetization prepared in this manner is spatially coded and scanned using the gradient echo sequence. FIG. 5 schematically shows the workflow of the MPRAGE sequence in which a magnetization preparation initially occurs; in the imaging phase all Fourier lines are subsequently acquired in the x-direction given a constant value kz along the z-axis. A recovery phase follows for a better SNR and thus a better contrast, and the sequence is subsequently repeated for further values of kz.

The MPRAGE sequence is used by default for depiction of T1-weighted images of the head with good contrast of the grey and white brain matters. The images are used both for routine clinical examinations, but also increasingly in recent times for automatic determination/segmentation of volumes of the brain, specific brain regions or specific tissue types (morphometry). A requirement for this purpose is that the data produce a good contrast between white brain matter and grey brain matter and a good contrast between cerebrospinal fluid (CSF) and grey brain matter.

In (semi-)automated methods for segmentation using T1-weighted MPRAGE data, the inversion time TI (i.e. the time from the beginning of the sequence up to reaching the k-space center during the scan of the gradient echo sequence) is typically set such that a compromise between grey-white contrast and grey-CSF contrast is made. In case of doubt, a manual segmentation or description of the contrast limits is then required. Moreover, the consequence is that an error in the description of the contrast limits is tolerated. This is a problem particularly at high field strengths, since the B1 homogeneity is generally poorer and makes it difficult to achieve completely automatic segmentation, in addition to causing dielectric resonance effects.

SUMMARY OF THE INVENTION

An object of the present invention is to provide a method and an apparatus for MRT imaging in which a good contrast is ensured both between grey and white brain matters and between grey brain matter and CSF.

This object is achieved according to the invention by a method for magnetic resonance imaging on the basis of a gradient echo sequence by excitation of nuclear spins in a subject and acquisition of radio-frequency signals caused by the excited nuclear spins, whereby including the following steps:

a) preparation of the magnetization of the spins by an inversion pulse;

b) implementation of a number of steps for spin excitation as well as acquisition of an RF response signal for a first image contrast, with the measurement data being acquired along a first two-dimensional slice, and this first two-dimensional slice being parallel to a plane spanned by two coordinate axes x, y that are orthogonal to one another;

c) implementation of a number of steps of the spin excitation, as well as acquisition of an RF response signal for a second image contrast, with the measurement data being acquired along the first two-dimensional slice that was present in step b); and d) repetition of the steps a) through c) for further two-dimensional slices that are offset parallel to the first two-dimensional slice along a third coordinate axis z that is orthogonal to the first two coordinate axes x and y.

The above object also is achieved in accordance with the invention by an apparatus for magnetic resonance imaging on the basis of a gradient echo sequence by excitation of nuclear spins and acquisition of radio-frequency signals arising from the excited nuclear spins with: a device for preparation of the magnetization of the spins by means of an inversion pulse; a device for implementation of a number of steps for spin excitation as well as measurement of an RF response signal for a first image contrast, wherein the measurement data are acquired along a first two-dimensional slice, and wherein this first two-dimensional slice is parallel to a plane spanned by two coordinate axes x, y that are orthogonal to one another; a device for implementation of a number of steps for spin excitation as well as acquisition of an RF response signal for a second image contrast, wherein the measurement data are acquired along the first two-dimensional slice; and a device for repetition of all steps for further two-dimensional slices that are offset parallel to the first two-dimensional slice along a third coordinate axis z that is orthogonal to the first two coordinate axes x and y.

The position of the two-dimensional slices along the z-coordinate axis is advantageously established by phase coding.

Furthermore, the measurement data are advantageously established along the two-dimensional slice in the direction of the x-coordinate axis by phase coding.

In an embodiment the measurement data along the two-dimensional slice in the direction of the y-coordinate axis are established by frequency coding.

A wait time can be provided after the inversion pulse.

The acquisition of the first image contrast and the second image contrast can be done with the following steps:

I) excitation of the spins by irradiation of an RF pulse,

II) acquisition of measurement data along the two-dimensional slice by readout of all values along the y-coordinate axis for a fixed value of the x-coordinate axis, and III) repetition of the steps I) and II) for various values along the x-coordinate axis.

A weighting of the longitudinal relaxation time T1 can ensue.

The time TI1 from the inversion pulse up to the irradiation of the RF pulse is advantageously selected for the first image contrast such that the contrast between grey brain matter and white brain matter is particularly high for the first image contrast.

Furthermore, the time TI2 from the inversion pulse up to the irradiation of the RF pulse for the second image contrast is advantageously selected such that the contrast between grey brain matter and cerebrospinal fluid is particularly high for the second image contrast.

The time TR between two inversion pulses can be between 2000 ms and 2600 ms.

DESCRIPTION OF THE PREFERRED EMBODIMENTS

Figure 1:
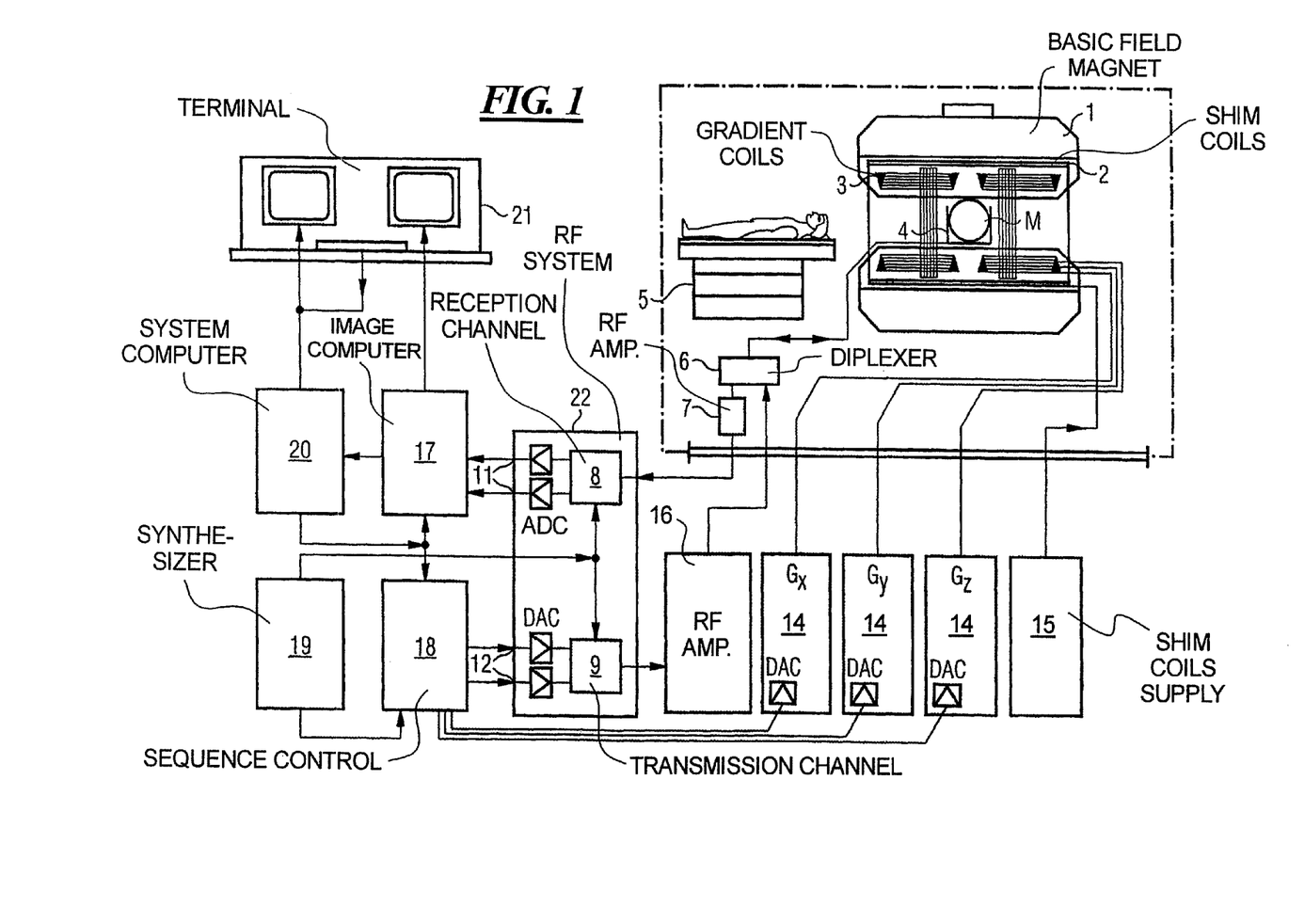
FIG. 1 schematically shows a nuclear magnetic resonance tomography apparatus

FIG. 1 is a schematic representation of a magnetic resonance imaging (magnetic resonance tomography) apparatus for generation of a magnetic resonance image of a subject according to the present invention. The design of the magnetic resonance tomography apparatus corresponds to the design of a conventional tomography apparatus, with the differences noted below. A basic field magnet 1 generates a temporally constant strong magnetic field for polarization or alignment of the nuclear spins in the examination region of the subject (such as, for example, a part of the human body to be examined). The high homogeneity of the basic magnetic field that is required for the magnetic resonance measurement is defined in a spherical measurement volume M into which the parts of the human body to be examined are introduced. Shim plates made from ferromagnetic material are mounted at suitable points to support the homogeneity requirements and in particular to eliminate temporally-invariable influences. Temporally-variable influences are eliminated by shim coils 2 that are activated by a shim power supply 15.

A cylindrical gradient coil system 3 that has three sub-windings is located in the basic field magnet 1. Each sub-winding is supplied with current from an amplifier 14 for generation of a linear gradient field in the respective directions of the Cartesian coordinate system. The first sub-coil of the gradient field system 3 generates a gradient $G_x$ in the x-direction, the second sub-coil generates a gradient $G_y$ in the y-direction and the third sub-coil generates a gradient $G_z$ in the z-direction. Each amplifier 14 has a digital-analog converter that is activated by a sequence controller 18 for time-accurate generation of the gradient pulses.

Located within the gradient field system 3 is a radio-frequency antenna 4 that converts the radio-frequency pulses emitted by a radio-frequency power amplifier 16 into an alternating magnetic field for excitation of the nuclei and alignment of the nuclear spins of the subject to be examined or of the region of the subject to be examined. The radio-frequency antenna 4 has one or more RF transmission coils and a number of RF reception coils in the form of an advantageously linear arrangement of component coils. The alternating field originating from the precessing nuclear spins (i.e. normally the nuclear spin echo signals caused by a pulse sequence made up of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number series is supplied as a real part and an imaginary part to respective inputs 12 of a digital-analog converter in the radio-frequency system 22, and from this to a transmission channel 9. In the transmission channel 9 the pulse sequences are modulated on a radio-frequency carrier signal having a base frequency that corresponds to the resonance frequency of the nuclear spins in the measurement volume.

The switch-over from transmission mode to reception mode ensues via a transmission-reception diplexer 6. The RF transmission coil of the radio-frequency antenna 4 radiates the radio-frequency pulses for excitation of the nuclear spins into the measurement volume M for excitation of the nuclear spins and samples resulting echo signals via the RF reception coils. The acquired magnetic resonance signals are phase-sensitively demodulated on an intermediate frequency in the reception channel 8 of the radio-frequency system 22, and converted into a real part and an imaginary part of the measurement signal in the analog-digital converter. An image is reconstructed by an image computer 17 from the measurement data acquired in this manner. The administration of the measurement data, the image data and the control programs ensues via the system computer 20. Based on control programs, the sequence controller 18 monitors the generation of the respective desired pulse sequences and the corresponding scanning of k-space. The sequence controller 18 controls the time-accurate switching of the gradients, the emission of the radio-frequency pulses with defined phase and amplitude and the reception of the nuclear magnetic resonance signals. The time base for the radio-frequency system 22 and the sequence controller 18 is provided by a synthesizer 19. The selection of corresponding control programs for generation of a nuclear magnetic resonance image as well as the representation of the generated nuclear magnetic resonance image ensues via a terminal 21 that has a keyboard as well as one or more screens.

Figure 6:
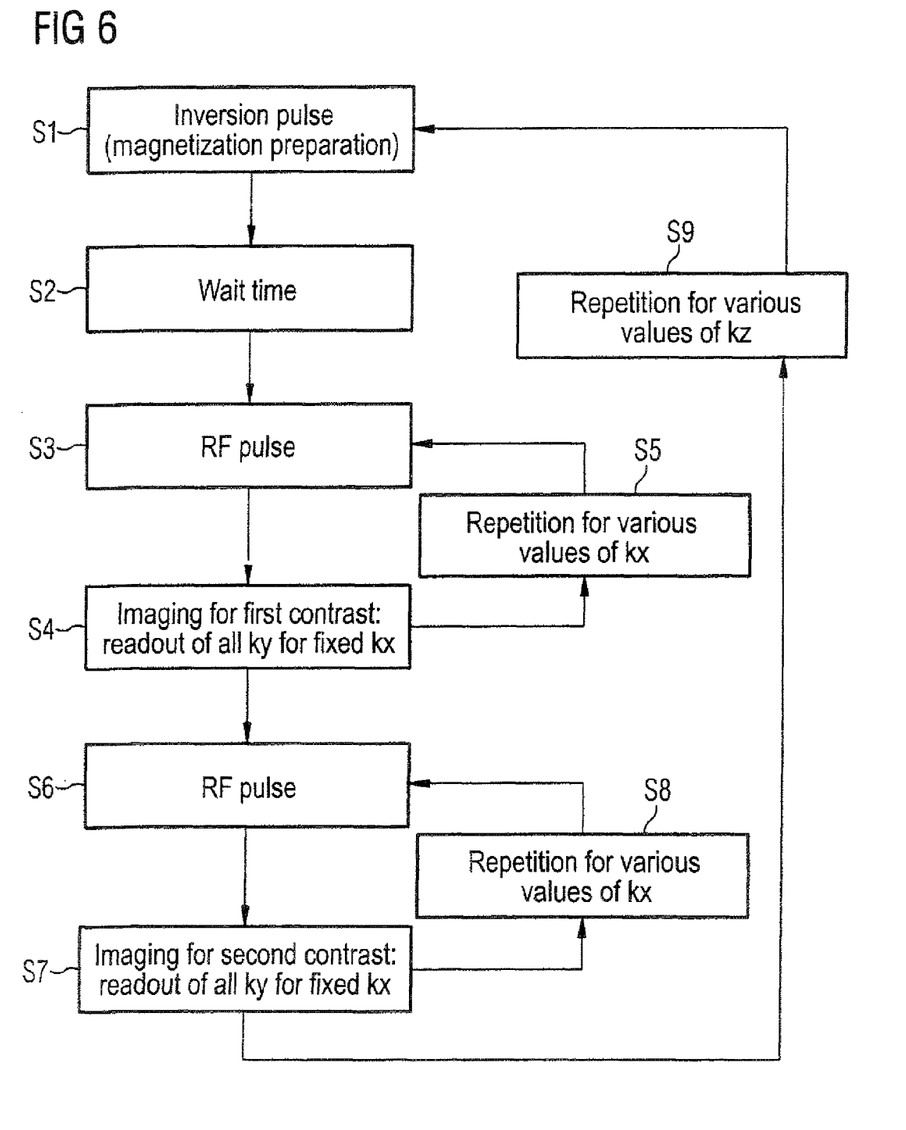
FIG. 6 schematically shows the workflow of the sequence according to the present invention.

FIG. 2 schematically shows the workflow of the sequence according to the present invention The sequence is based on the MPRAGE sequence. As already explained, in the MPRAGE sequence a recovery time is inserted after the acquisition of the RF signal. In this recovery time only a minimal contrast of grey brain matter and white brain matter is still present, but the contrast between grey brain matter and CSF is particularly good during this recovery time. According to the present invention, a further data set is acquired during this recovery time, which acquisition can possibly occur with higher bandwidth in order to conclude the measurement during the recovery time. The standard measurement can occur at an earlier point in time, which can possibly achieve an even better contrast between grey brain matter and white brain matter.

The homogeneous basic magnetic field is generated by means of the basic field magnet 1. According to the present sequence a magnetization preparation is thus implemented in step S1 by an inversion pulse. Here the inversion pulse can advantageously amount to 180°. In a next step S2 a wait time is inserted in order to obtain a better contrast or a better SNR. In the next step S3 an RF pulse is radiated by the RF antenna 4, ideally with a flip angle á of <90°. The imaging for the first contrast, i.e. for the contrast between grey brain matter and white brain matter, ensues by readout of the RF signal in the step S4 in k-space all $k_y$ are read out for a fixed $k_x$. According to step S5 the steps S3 and S4 are repeated for various values of $k_x$. In step S6 an RF pulse (likewise with a flip angle á of <90°) is subsequently newly radiated by means of the RF antenna 4. The imaging for the second contrast, i.e. for the contrast between grey brain matter and CSF, ensues in the subsequent step S7. For this purpose all $k_y$ for a respective fixed $k_x$ are read out again. In step S8 the steps S6 and S7 are repeated for various values of $k_x$. Finally, in step S9 all steps of the sequence S1 through S7 are repeated for various values of $k_z$. The coding along the gradients $G_x$, $G_y$, and $G_z$ ensues with the gradient coil system 3 which is controlled by the sequence controller 18.

Figure 7:
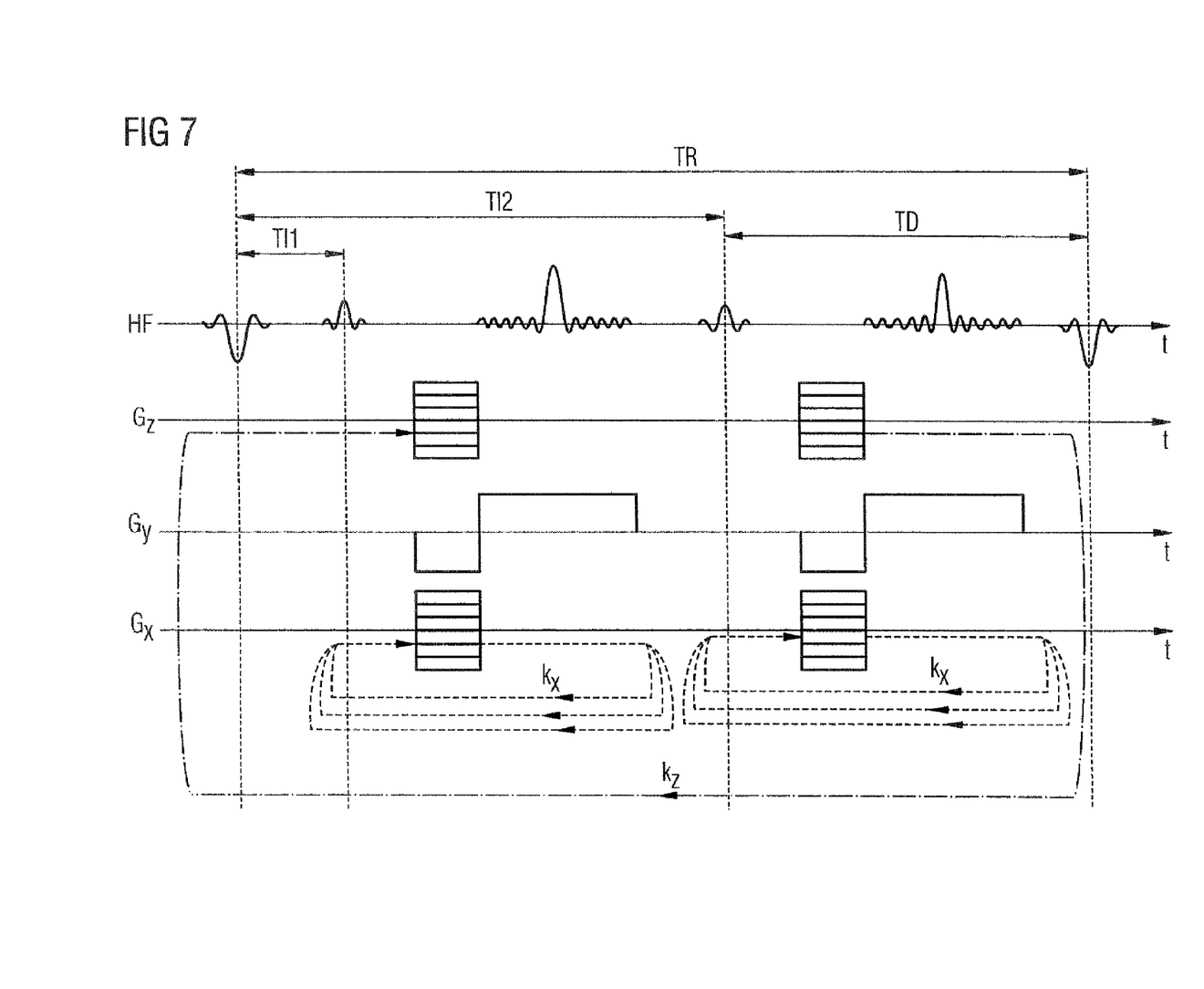
FIG. 7 shows an exemplary embodiment of the sequence according to the present invention.

FIG. 7 shows an exemplary embodiment according to the sequence of the present invention. The time axis is plotted to the right, the pulse scheme is shown in the first line and the gradient schematics are shown in the further three lines. The inversion pulse for magnetization preparation ensues at the beginning of the sequence. After the first inversion time $TI_1$ the RF pulse is radiated by the RF antenna 4. At the same time the gradient fields $G_z$, $G_y$ and $G_x$ are subsequently switched on by the sequence controller 18. The gradient $G_z$ allows a phase coding in the direction of the z-coordinate axis, the gradient $G_x$ allows a phase coding along the x-coordinate axis, and the gradient $G_y$ (due to activation and subsequent reverse-polarization) causes a cancellation of the dephasing of the transverse magnetization, whereby the gradient echo is induced. In the subsequent acquisition phase k-space is spatially coded in the direction of the y-axis by the gradient $G_y$. The workflow of the sequence from radiation of the RF pulse up to the termination of the readout of the first image contrast is ultimately repeated for various values $k_x$ of the gradient $G_x$. After a further time TI2 the radiation of the second RF pulse ensues by means of the RF antenna 4 for the second image contrast. In correspondence with the acquisition of the first image contrast, gradients $G_z$ and $G_x$ for phase coding in the x-direction and z-direction are activated by the sequence controller 18 along with a gradient $G_y$ for spatial coding along the y-coordinate axis. The sequence for the second image contrast is likewise repeated for various values of $k_x$. The time TD designates the recovery phase in the original MPRAGE sequence which, according to the present invention, is now used for the imaging of the second contrast. The repetition time TR shows the time for the passage of a sequence, i.e. the time from irradiation of an inversion pulse up to the irradiation of a next inversion pulse. The sequence is repeated for various values of $k_z$.

A reliable demarcation of grey brain matter, white brain matter and CSF is enabled by the acquisition of a further data set with different contrast. This can alternatively be realized by separate evaluation or by calculated/combined images from the two (or even more) contrasts by processing of the measurement data in the image computer 17.

It is advantageous that the use of two or more contrasts increases the precision of segmentation methods. This moves a step closer to a fully-automated evaluation of such data sets, since manual contributions are presently still required. It is also advantageous that the total measurement time normally does not need to be increased. If the various contrasts are already combined with a suitable algorithm during the image recon, the work expenditure of the user is not altered by additional images.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging based on a gradient echo sequence, by exciting nuclear spins in a subject and detecting the radio frequency signals arising from the excited nuclear spins, said method comprising the steps of:
   (a) preparing magnetization of spins in a subject by exposing the subject to only a single inversion pulse;
   (b) following said single inversion pulse, executing a plurality of steps to excite nuclear spins in the subject and to detect an RF response signal, arising due to the excited nuclear spins, for a first image contrast, said RF response signal being detected for excited nuclear spins in a first two-dimensional slice in a plane defined by a first coordinate axis and a second coordinate axis that are perpendicular to each other to obtain a first complete image of said first slice, having said first image contrast;
   (c) also following said single inversion pulse, executing a plurality of steps to excite further nuclear spins in the subject and detecting a further RF response signal, arising from the excited further nuclear spins, for a second image contrast, different from said first image contrast, said further RF response signal also arising from excited further nuclear spins in said first two-dimensional slice to obtain a second complete image of said first slice, having said second contrast; and
   (d) repeating steps (a) through (c) for a plurality of further two-dimensional slices that are respectively parallel to said first two-dimensional slice and offset from first two-dimensional slice along a third coordinate axis that is perpendicular to said first and second coordinate axes.

2. A method as claimed in claim 1 comprising establishing an offset position of each of said first two-dimensional slice and each of said further two-dimensional slices along said third coordinate axis by phase coding.

3. A method as claimed in claim 1 comprising establishing a position of measurement data, represented by said RF response signal in step (b), said further RF response signal in step (c) and said RF response signal and said further RF response signal in step (d), along said first coordinate axis by phase coding.

4. A method as claimed in claim 1 comprising designating a position of measurement data, represented by said RF response signal in step (b), said further RF response signal in step (c) and said RF response signal and said further RF response signal in step (d), along said second coordinate axis by frequency coding.

5. A method as claimed in claim 1 comprising waiting for a pre-determined time after step (a) before beginning step (b).

6. A method as claimed in claim 1 wherein said plurality of steps to excite nuclear spins in step (b) and said plurality of steps to excite further nuclear spins in step (c) comprises:
   (I) exciting said spins by emitting a further RF pulse into the subject;
   (II) acquiring measurement data represented by said further RF response signal in said two-dimensional slice by reading out measurement data along said second coordinate axis for a fixed value of said first coordinate axis; and (III) repeating steps (I) and (II) for a plurality of different values along said first coordinate axis.

7. A method as claimed in claim 1 wherein measurement data represented by said RF response signal in each of steps (b), (c) and (d) exhibit a longitudinal relaxation time $T_1$, and weighting said longitudinal relaxation time $T_1$.

8. A method as claimed in claim 1 wherein each of said first two-dimensional slice and said further two-dimensional slices are located in the brain of the subject, and wherein said plurality of steps to excite nuclear spins in step (b) include irradiation of an RF pulse, and selecting a time $TI_1$, from said single inversion pulse to irradiation of said RF pulse in step (b) to produce a high contrast, as said first image contrast, between grey matter and white matter in the brain of the subject.

9. A method as claimed in claim 1 wherein each of said first two-dimensional slice and said further two-dimensional slices are located in the brain of the subject, and wherein said plurality of steps to excite further nuclear spins in step (c) include irradiation of an RF pulse, and selecting a time $TI_2$, from said single inversion pulse to irradiation of said RF pulse in step (c), to produce a high contrast, as said second image contrast, between grey matter and cerebral spinal fluid in the brain of the subject.

10. A method as claimed in claim 1 comprising setting a time between successive single inversion pulses in respective repetitions step (d) in a range between 2,000 ms and 2,600 ms.

11. An apparatus for magnetic resonance imaging of a subject based on a gradient echo sequence by exciting nuclear spins in the subject and detecting radio frequency signals arising from the excited nuclear spins, said apparatus comprising:
a magnetic resonance data acquisition device configured to receive a subject therein and comprising a basic field magnet that aligns nuclear spins in the subject, a gradient coil system that generates a plurality of orthogonal gradient fields in the subject, and an RF system that radiates RF energy into the subject and detects RF signals arising from the subject; and
a control unit that operates said magnetic resonance data acquisition system by (a) preparing magnetization of spins in a subject by exposing the subject to only a single inversion pulse, (b) executing a plurality of steps to excite nuclear spins in the subject and to detect an RF response signal, arising due to the excited nuclear spins, for a first image contrast, said RF response signal being detected for excited spins in a first two-dimensional slice in a plane defined by a first coordinate axis and a second coordinate axis that are perpendicular to each other to obtain a first complete image of said first slice, having said first image contrast, (c) executing a plurality of steps to excite further nuclear spins in the subject and detecting a further RF response signal, arising from the excited further nuclear spins, for a second image contrast, different from said first image contrast, said RF response signal also arising from excited further nuclear spins in the entirety of said first two-dimensional slice to obtain a second complete image of said first slice, having said second contrast, and (d) repeating steps (a) through (c) for a plurality of further two-dimensional slices that are respectively parallel to said first two-dimensional slice and offset from first two-dimensional slice along a third coordinate axis that is perpendicular to said first and second coordinate axes.

12. An apparatus as claimed in claim 11 wherein said control unit operates said gradient coil system to establish an offset position of each of said first two-dimensional slice and each of said further two-dimensional slices along said third coordinate axis by phase coding.

13. An apparatus as claimed in claim 11 wherein said control unit operates said gradient coil system to designate a position of measurement data, represented by said RF response signal step (b), said further RF response signal in step (c) and said RF response signal and said further RF response signal in step (d), along said first coordinate axis by phase coding.

14. An apparatus as claimed in claim 11 wherein said control unit operates said gradient coil system to designate a position of measurement data, represented by said RF response signal step (b), said further RF response signal in step (c) and said RF response signal and said further RF response signal in step (d), along said second coordinate axis by frequency coding.

15. An apparatus as claimed in claim 11 wherein said control unit operates said gradient coil system to wait for a pre-determined time after step (a) before beginning step (b).

16. An apparatus as claimed in claim 11 wherein said control unit operates said magnetic resonance data acquisition system to excite nuclear spins in step (b) and to excite further nuclear spins in step (c) by (I) exciting said spins by emitting an RF pulse into the subject, (II) acquiring measurement data represented by said RF response signal in said first two-dimensional slice by reading out measurement data along said second coordinate axis for a fixed value of said first coordinate axis, and (III) repeating steps (I) and (II) for a plurality of different values along said first coordinate axis.

17. An apparatus as claimed in claim 11 wherein measurement data represented by said RF response signal step (b), said further RF response signal in step (c) and said RF response signal and said further RF response signal in step (d) exhibit a longitudinal relaxation time $T_1$, and weighting said longitudinal relaxation time $T_1$.

18. An apparatus as claimed in claim 11 wherein each of said first two-dimensional slice and said further two-dimensional slices are located in the brain of the subject, and wherein said wherein said control unit operates said magnetic resonance data acquisition system to excite nuclear spins in step (b) by irradiating an RF pulse, and selecting a time $T_1$, from said single inversion pulse to irradiation of said RF pulse in step (b) to produce a high contrast, as said first image contrast, between grey matter and white matter in the brain of the subject.

19. An apparatus as claimed in claim 11 wherein each of said first two-dimensional slice and said further two-dimensional slices are located in the brain of the subject, and wherein said control unit operates said magnetic resonance data acquisition system to excite further nuclear spins in step(c) by irradiating an RF pulse, and selecting a time $T_2$, from said single inversion pulse to irradiation of said RF pulse in step (c), to produce a high contrast, as said second image contrast, between grey matter and cerebral spinal fluid in the brain of the subject.

20. An apparatus as claimed in claim 11 wherein said control unit sets a time between successive single inversion pulses in respective repetitions in step (d) in a range between 2,000 ms and 2,600 ms.

* * * * *